United States Patent [19]

Kryder

[11] 4,035,785
[45] July 12, 1977

[54] BUBBLE DOMAIN SENSOR-ERROR DETECTOR

[75] Inventor: Mark Howard Kryder, Yorktown Heights, N.Y.

[73] Assignee: International Business Machines Corporation, Armonk, N.Y.

[21] Appl. No.: 645,739

[22] Filed: Dec. 31, 1975

[51] Int. Cl.$^2$ .............. G11C 11/14; G11C 19/00
[52] U.S. Cl. ............ 340/174 TF; 340/174 CA; 340/174 RC
[58] Field of Search .......... 340/174 CA, 174 EB, 340/174 TF, 174 RC

[56] References Cited

U.S. PATENT DOCUMENTS

| | | | |
|---|---|---|---|
| 3,820,089 | 6/1974 | Lama | 340/174 CA |
| 3,858,189 | 12/1974 | Beausoleil et al. | 340/174 CA |
| 3,883,858 | 5/1975 | Lienhard et al. | 340/174 CA |

Primary Examiner—Vincent P. Canney
Attorney, Agent, or Firm—Jackson E. Stanland

[57] ABSTRACT

An improved thick film sensor for detection of magnetic bubble domains which can be configured to provide soft error detection and full data rate sensing. The sensor can be fabricated using single level masking techniques and is typically a magnetoresistive sensor comprised of NiFe. In its basic configuration, the sensor is comprised of two sets of magnetoresistive elements, each set including a sensor element and a dummy element, where both the sensor element and the dummy element provide a signal due to the bubble domain to be sensed. The magnetoresistive elements are arranged in a bridge circuit to give full data rate sensing and soft error detection. In a preferred embodiment, chevron expander-detectors are used, although the geometry of the sensor and dummy elements is not limited to chevron-type geometries.

13 Claims, 4 Drawing Figures

BUBBLE DOMAIN SENSOR-ERROR DETECTOR

BACKGROUND OF THE INVENTION

1. Field of the Invention

This invention relates to improved thick film sensors for detection of magnetic bubble domains, and more particularly to a sensor configuration which provides soft error detection and full data rates.

2. DESCRIPTION OF THE PRIOR ART

Various techniques for sensing magnetic bubble domains are known in the art. Some of these utilize magnetoresistive elements which are of the same thickness as the magnetic elements used to propagate the bubble domains in a host magnetic medium. For instance, a chevron propagation circuit and chevron sensor having the same thickness are shown in U.S. Pat. No. 3,713,120. Additionally, IEEE Transactions on Magnetics, Volume MAG-9, No. 3, pp. 474-480, September 1973 describes a fabrication technique for making magnetic bubble circuits using single masking level processing. In this type of processing, the magnetoresistive sensor is deposited at the same time as the magnetic propagation elements, and has the same thickness as the propagation elements. Of course, this is advantageous from a processing standpoint and overcomes some of the problems, such as corrosion, etc., which are associated with thin film detectors having thicknesses of the order of approximately 200-400 Angstroms.

In spite of the advantages of the thick film chevron detectors, there are disadvantages with such detectors as was pointed out by R. A. Baugh, R. B. Clover, and L. S. Cutler ("Some Aspects of Magnetic Bubble Memory Module Design"), which was presented as invited paper 22.2 at the 1974 International Conference on Magnetics (Toronto, May 1974). As those authors point out, thick film chevron expander-detectors are not routinely used to sense bubble domains at a data rate equal to the data rate of the bubble domain in the propagation circuits. This is a limitation of the sensor itself wherein the thick film chevron sensor often has two bubble domains in magnetic field coupling promixity to it during certain phases of a single cycle of the rotating magnetic drive field. Therefore, the sensor provides a sense signal which is a combination of signals due to two data bubble domains. In order to compensate for this, it has been customary in the past to detect with the sensor only in every other cycle of field rotation.

In the practice of the present invention, a configuration is shown which enables the use of thick film magnetoresistive elements for bubble domain sensing at a rate equal to the rotating magnetic drive field frequency, thereby overcoming the aforementioned disadvantage of the prior art. Additionally, the present invention can also be configured to provide soft error detection, where "soft errors" are any errors associated with the bubble domain sensor. As an example, such errors are those produced by faulty sensors or by sensors having improperly working sense amplifiers associated therewith. Another type of soft error is that due to the metallurgy or fabrication of the sensor element itself. Generally, these soft errors include any type of error which can be attributed to the sensor or the circuitry associated with the actual sensing element.

In the practice of the present invention, sensor-dummy pairs are used for detection of the bubble domains, where the dummy sensors actually respond to the same bubble domain to which the associated sensor responds. In this manner, the present invention differs from well known differential sensing schemes using sensor-dummy pairs, where the bubble domains never come into flux coupling proximity to the dummy sensors. Such differential sensing schemes using sensor-dummy pairs to compensate for noise, temperature variations, effect of rotating magnetic field, etc. are described in, for example, U.S. Pat. Nos. 3,883,858, 3,736,419, and IBM Technical Disclosure Bulletin Volume 16, No. 7, December 1973, p. 2395. In addition to these differential sensing schemes, U.S. Pat. No. 3,720,928 describes a sensing configuration comprised of spatially staggered sensors which respond to magnetic bubble domains in different channels at different times, thereby allowing time division multiplexing and sharing of a single sense amplifier.

As will be appreciated by those skilled in this art, thick film magnetic bubble domain sensors have not been provided which will accurately provide sensing at data rates corresponding to bubble domain propagation rates in other circuits of the magnetic chip, and which will allow soft error detection.

Accordingly, it is a primary object of the present invention to provide improved thick magnetic bubble domain sensors which can be operated at frequencies equal to that used to propagate bubble domains in the magnetic medium.

It is another object of this invention to provide a thick magnetic film bubble domain detector in which soft error detection is achieved while sensing at high data rates.

It is another object of this invention to provide an improved magnetic thick film bubble domain detector which can be fabricated at the same time and in the same deposition step as that used to fabricate propagation elements for moving magnetic bubble domains.

BRIEF SUMMARY OF THE INVENTION

This improved magnetic element detector is typically comprised of magnetic elements which exhibit a magnetoresistive effect or a Hall effect. For instance, compositions of NiFe such as permalloy (a trademark of Allegheny Ludlum Corporation) can be utilized as is well known in the art. These sensor elements are advantageously deposited at the same time as the magnetic elements used for propagating bubble domains in the host magnetic material. Therefore, a single masking level process provides the propagation elements and the sensing elements.

This improved bubble domain sensor is comprised of a bridge circuit including at least four sense elements, all of which are responsive to bubble domains in the data stream, although only two are responsive at any one time. This distinguishes prior art bridge circuit sensing techniques where the dummy sensors are never actually flux linked to the bubbles to be sensed. Use of the sensor-dummy pairs in this way provides soft error detection, since the dummy sensor provides verification of the accuracy of the associated sensing element.

In a preferred embodiment, at least two pairs of sensor-dummy elements are used and these are arranged in a bridge circuit. Each sensor-dummy pair is responsive to a bubble domain data stream where no data is present in alternate bit positions of each data stream. Additionally, alternate bit positions in each data stream are one drive field cycle apart. Consequently, the bridge circuit senses bubble domain data during each cycle of the drive field used to move bubble domains in the magnetic medium, except that each sensor-dummy pair responds to a data input on alternate cycles. Therefore, the bridge circuit provides sensing at full data rates but each individual sensor-dummy pair detects incoming data bubbles in every other bit position. This overcomes the limitation of each thick sensor with respect to sensing rate.

In a preferred embodiment, the sensors and dummies are comprised of magnetoresistive elements, such as NiFe. Generally, each sensor and dummy element in the bridge is comprised of the same material, has the same thickness and geometry, and the spacings between each of the sensors and their associated dummy sensors are the same. Although each of these considerations need not be present, a design which achieves them provides a bridge circuit which is more easily balanced and more reliable. Also, the requirements of any associated circuitry, such as sense amplifiers, are eased when this is done.

In contrast with conventional error detection schemes where data is specially coded to allow error detection, the data need not be specially coded herein. Also there is no loss of density (no need for special bits reserved for error detection codes) in the present invention, which achieves soft error detection and full data rate due to the physical arrangement of the present bridge circuit.

These and other objects, features and advantages will be more apparent from the following more particular description of the preferred embodiments.

DETAILED DESCRIPTION OF THE PREFERRED EMBODIMENTS

FIG. 1

Figure 1:
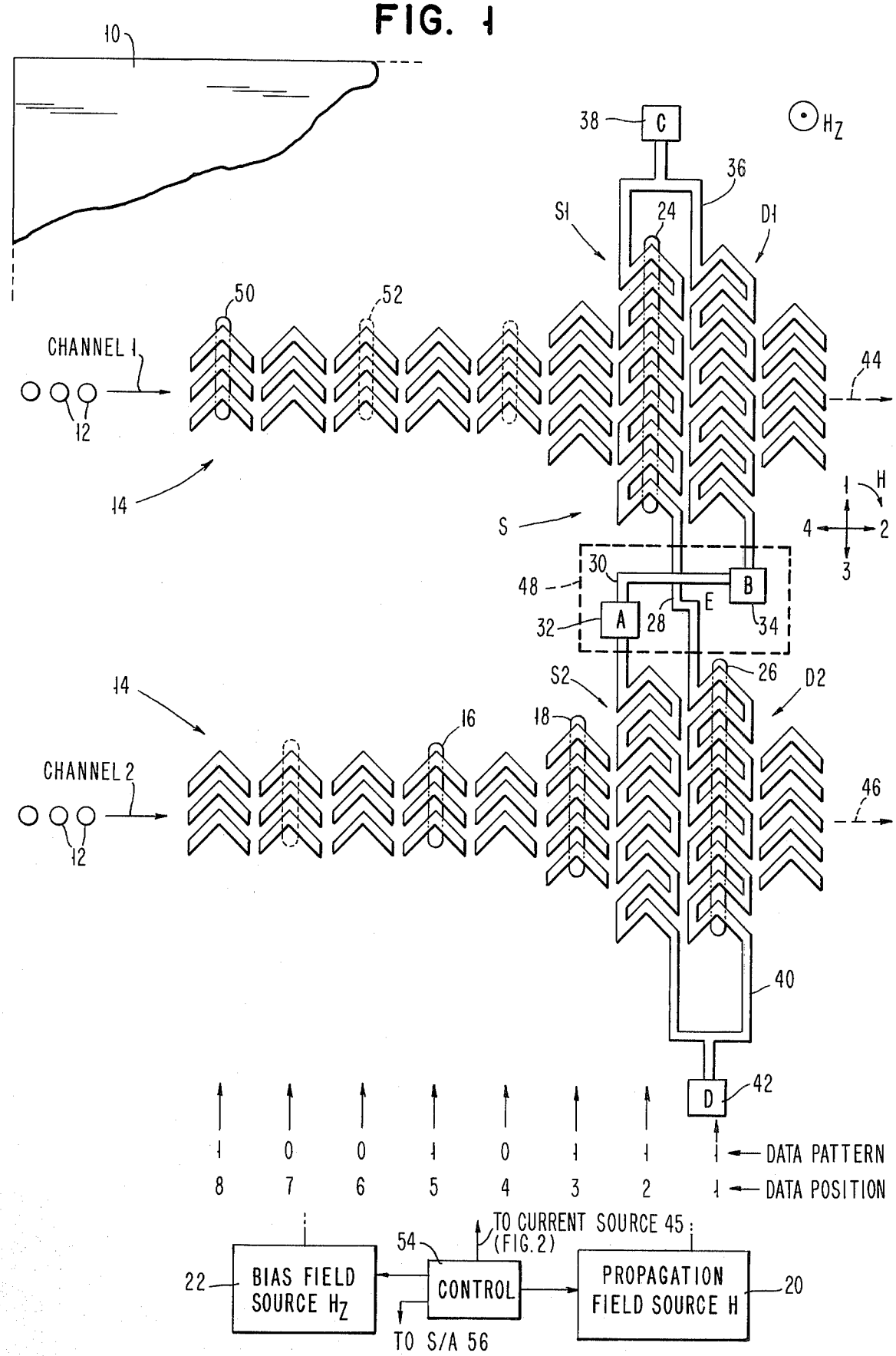
FIG. 1 is an illustration of a sensor configuration which provides soft error detection and sensing at full data rates.

In FIG. 1, a magnetic bubble domain medium 10, which could be, for instance, a garnet or an amorphous magnetic material, has magnetic bubble domains 12 therein which are moved by conventional circuitry, such as the chevron elements 14. The chevron elements are typically comprised of a soft magnetic material, such as NiFe.

In FIG. 1, two channels 1 and 2 are provided for propagation of the bubble domains 12 to the area of the sensor, generally designated S. As is well known in the art, bubble domains will propagate from one column of chevron elements of another as the magnetic drive field H rotates in the plane of the magnetic medium 10. As the number of chevron elements in each column increases, the bubble domains will expand into stripe domains while they are propagating. This is represented by the strip domains 16 and 18 in channel 2.

The propagation field source 20 provides the reorienting magnetic drive field H, while a bias field source 22 provides a magnetic field $H_z$ having a direction opposite to the magnetization direction of the bubble domains 12. As is well known, this field stabilizes the size of the magnetic bubble domains.

As the bubble domains in each channel propagate to the right in FIG. 1, they will enter the bubble domain sensor S. This sensor is a bridge type arrangement of magnetoresistive sensing elements S1 and S2, associated with dummy sensing elements D1 and D2, respectively. Elements S1, D1, S2 and D2 are comprised of, for instance, columns of chevron permalloy elements joined as shown. This type of chevron expander-sensor is well known in the art and is used to expand a bubble domain in order to provide a larger signal For example, expanded domain 24 is being sensed by sence element S1 while expanded domain 26 is being sensed by dummy sensor D2 in this figure.

Figure 2:
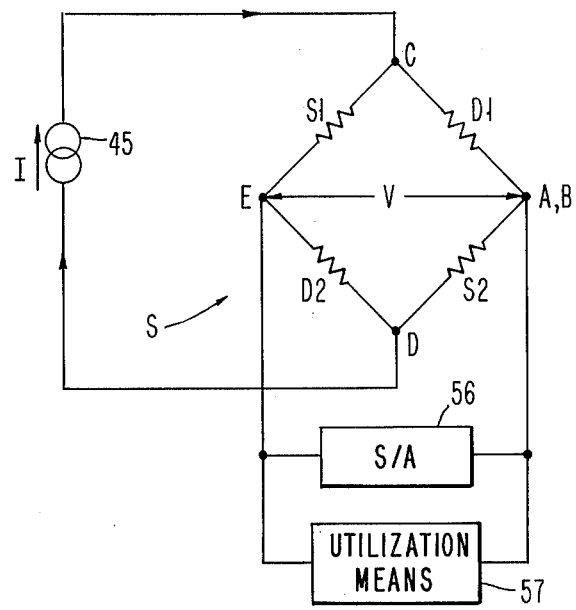
FIG. 2 is an equivalent circuit diagram of the bridge circuit arrangement of FIG. 1.

The thicknesses of the various propagation elements 14 and the sensor and dummy sensor elements S1, D1, S2 and D2 are the same, having been deposited at the same time through the same mask. Therefore, the sensor S is comprised of at least two groups of thick film elements arranged in a particular way as will be more apparent when FIG. 2 is discussed. At this point, it is only important to note that dummy sensor D1 is positioned such that expanded domain 24 will move under D1 during the next cycle of rotation of the field H. This means that D1 will also see the effect of the domain 24 that is being sensed. In other words, the dummy sensors D1 and D2 in this arrangement actually provide output signals representative of the bubble domains which are previously sensed by the associated sensor elements S1 and S2.

Sensor S1 is electrically connected to dummy D2 via the connection 28, while sensor S2 is electrically connected to dummy sensor D1 via the electrical connection 30. Electrical connections 28 and 30 are electrically insulated from one another during the fabrication process. Electrical conductor 30 is connected to sensor S2 at the contact land 32 indicated by block A and is connected to dummy sensor D1 at the contact land 34 which is indicated by block B. Also, sensor S1 and dummy sensor D1 are electrically connected to each other via the connection 36, which is also connected to contact land 38 (block C). Correspondingly, sensor S2 and dummy sensor D2 are electrically connected to one another via connector 40 which is electrically connected to a contact land 42 indicated by block D. Although it is not shown in this FIG., a current source 44 (FIG. 2) is electrically connected to contact lands C and D. The sensor elements can be made in a single, high resolution masking step and the interconnections can be provided using a low resolution, non critically aligned masking step.

After being detected by the sensor S1 and the dummy sensor D1, the magnetic domain 24 continues moving to the right as the magnetic field H reorients and will move in the direction of arrow 44. Correspondingly, the magnetic domain 26 will also move to the right in channel 2, in the direction of arrow 46, as the field H continues to reorient in the plane of magnetic medium 10. Domains which leave the sensor region S can be annihilated or continually circulated in a shift register. Also, they may be used for other circuit functions as is well known in the art.

As will be more apparent from FIG. 2, the sensor and dummy elements S1, S2, D1 and D2 are electrically connected into a bridge circuit. In order to provide a balanced bridge, the physical properties of the elements S1, S2, D1 and D2 should be the same. Therefore, these elements S1, D1, S2, and D2 are typically comprised of the same number of individual chevron stripes and have the same thicknesses, widths, and lengths. Additionally, the various interconnectors 28, 30, 36 and 40 are chosen to make the amount of magnetic material the same in all sides of the bridge circuit. When NiFe is also used as an electrical conductor, it is even more important to insure that none of the elements S1, S2, D1, and D2, together with the interconnecting lines, are different from one another. To achieve this, it is often advantageous to provide a conducting layer, such as Au, over the various electrical connectors shown within the dashed outlines of box 48. Of course, the electrical conductor 28 is insulated from electrical conductor 30. Use of the gold overlayers insures that these various conductors will contribute no magnetoresistance signal to the bridge circuit. Still further, electrical conductor 36 and its associated contact land 38 are made identical in thickness, width, length, and materials as the conductor 40 and its associated contact land 42, if these conductors and contact lands are comprised of magnetic material. In the alternative these conductors and contact lands could be coated with an overlayer of gold, also.

In FIG. 1, the particular data pattern in each of the channels 1 and 2 is indicated, as well as the position of the data. That is, the magnetic domain configuration shown in FIG. 1 is that which is present at clock pulse 1. During the next cycle of rotation of field H, all magnetic domains will move one cycle to the right. Therefore, on the eighth cycle of field H, domain 50 in channel 1 will be located beneath the center of dummy sensor D1.

In FIG. 1, data indicating the presence of magnetic domains is indicated by solid lines, such as domain 50, while data represented by the absence of a bubble domain is represented by the dashed lines, such as 52 in channel 1. The data in each propagation channel 1 and 2 is present in alternate bit positions of these channels and the data streams in channels 1 and 2 are displaced from one another by one cycle. Thus, in FIG. 1, data is present in channel 1 in data positions 2, 4, 6, and 8, while data is present in propagation channel 2 in data positions 1, 3, 5, 7, etc. Because data is present in alternate bit positions in each of the propagation channels, each sensor-dummy sensor pair can be operated at full data rates without error since only one magnetic bubble domain bit will be in flux coupling proximity with the sensor elements S1 or S2 during each clock pulse. However, when sensor element S1 is not detecting data, sensor element S2 is detecting data, so the overall sensor S is providing an output signal during each cycle of reorientation of field H. Accordingly, the sensing rate is equivalent to the data rate for movement of bubble domains in the magnetic medium, and therefore the problem associated with previous thick film sensors is overcome.

As another feature of the arrangement of FIG. 1, soft error detection is provided since the dummy sensors D1 and D2 actually sense the same bubble domains as were sensed by the associated sensor elements S1 and S2 during the previous cycle. Thus, the outputs of the dummy sensors D1 and D2 can be used to verify the accuracy of the sensor elements S1 and S2. This will be explained more fully with respect to FIG. 2 and the truth table to be later described.

Figure 3:
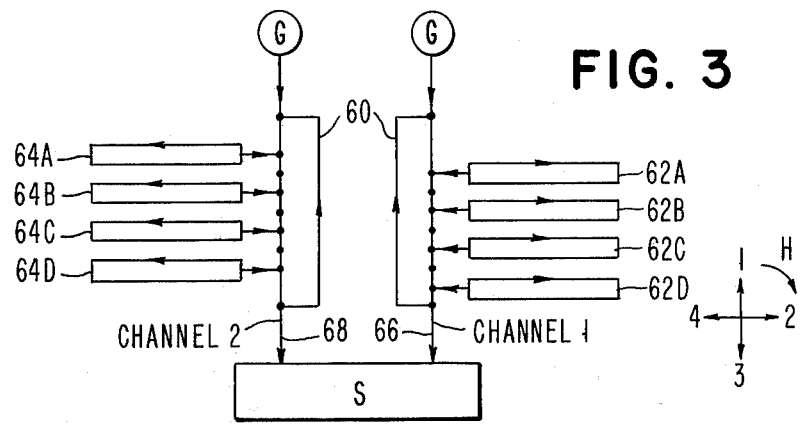
FIG. 3 shows a memory system (major/minor loop) used in combination with the bridge circuit sensor of the present invention.

In one embodiment, data in channel 1 comes from one bubble domain chip or a portion of the bubble domain chip, while data in propagation channel 2 comes from another bubble domain chip or from another portion of the same bubble domain chip. This allows multiple data paths to use the same sensor S and the same sense amplifier, as will be more apparent from FIGS. 2–4. Circuitry for providing the data streams along channels 1 and 2 is shown in FIG. 3 (from major/minor loop memory) and in FIG. 4 (switch to deflect data into two streams).

A control circuit 54 provides timing pulses to current source 45 (FIG. 2) and sense amplifier 56 (FIG. 2) during each cycle to provide the sense current I through the dummy and sensor elements and to detect the output voltage pulses in the sense amplifier.

FIG. 2

The electrical interconnection of the sensors S1, S2, and the dummy sensors D1, D2 is shown in this figure. As is apparent, these sensors and dummy sensors are arranged in a bridge circuit and the current source 45 provides the necessary current in the sensor and dummy sensor elements during each sense operation. A sense amplifier 56 is connected across the bridge circuit and more particularly to electrical nodes E and A, B. Therefore, the sense amplifier is connected to the midpoint of conductor 28 and to contact lands 32 and 34. Utilization means 57, such as a computer, is connected to said sense amplifier to utilize the sense signals therefrom. Correspondingly, curent source 45 is electrically connected to electrical nodes C and D, corresponding to contact lands 38 and 42. The sensor elements S1 and S2, as well as the dummy sensors D1 and D2 are indicated by resistors in FIG. 2. When these elements are magnetoresistive elements, their resistance will change in the presence of a magnetic bubble domain in flux coupling proximity thereto and this will produce a voltage change across the elements. The arrangement of these elements into a bridge circuit provides soft error detection and also detection at full data rates.

The truth table below shows the output $V = V_E - V_{AB}$ from the bridge circuit for each possible data combination that could occur. In Table 1 it is assumed that a bubble domain passing under a sensor or dummy sensor will produce an increase in the resistance of that sensor or dummy sensor. Thus, the voltages at the electrical nodes E and AB can be computed to determine the bridge output for any data pattern. On even clock pulses 2, 4, 6, etc., there is no data in either S1 or D2 while for odd clock pulses 1, 3, 5, etc., there is no data in either S2 or D1. The presence of a bubble domain in flux coupling proximity to either a sensor S1, S2 or a dummy sensor D1, D2 is indicated by the numeral 1 in this table, while the absence of a bubble domain in flux coupling proximity to the sensors S1, S2 or dummy sensors D1, D2 is indicated by the numeral 0.

| S1 | D1 | Truth Table S2 | D2 | $V = V_E - V_{AB}$ |
|---|---|---|---|---|
| 1 | 0 | 0 | 1 | 0 |
| 1 | 0 | 0 | 0 | −V |
| 0 | 0 | 0 | 1 | +V |
| 0 | 0 | 0 | 0 | 0 |
| 0 | 1 | 1 | 0 | 0 |
| 0 | 0 | 1 | 0 | −V |
| 0 | 1 | 0 | 0 | +V |

| | | Truth Table | | |
|---|---|---|---|---|
| S1 | D1 | S2 | D2 | $V = V_E - V_{AB}$ |
| 0 | 0 | 0 | 0 | 0 |

As an example of the operation of the bridge circuit, during clock pulse 1 and elongated bubble domain 24 is detected by sensor S1 while an elongated bubble domain 25 is detected by dummy sensor D2. This means that the voltage at electrical node C (FIG. 2) will increase while that at electrical node E will decrease due to the voltage drop across S1. However, the voltage drop across dummy sensor D2 will mean that there will be an increase in voltage at electrical node E and a decrease at electrical node D. This will balance out the effect of the voltage drop across S1 with the end result that the voltage at electrical node E will be the same as that at electrical node AB. Consequently, the output voltage $V = V_E - V_{AB}$ will be zero, since $V_E$ and $V_{AB}$ are both zero. This is the situation depicted in the first row of the truth table.

A close examination of the table reveals that zero volts output designates no change in the combined data stream (odd and even bits) and that +V indicates a transition from a 1 to a 0 while a −V indicates a transition from a 0 to a 1. This coding scheme can be used to reconstruct the actual data stream and additionally has the advantage that all data is sensed twice (by the sensor and then by the associated dummy sensor). Therefore, soft errors, defined as errors occurring in the detector output and not in the actual data pattern, are identifiable when they occur. For example, if two output pulses of +V follow each other without an intervening −V pulse, it is apparent that a soft error occurred, because the first +V means that the data went from 1 to 0 and it is then impossible to obtain that same transition from 1 to 0 without first having the transition from 0 to 1 (−V).

This type of coding has been used in the past to read magnetic tape bits. However, it has been discovered that if a bridge circuit is properly configured it can be used to not only sense soft errors but also to provide thick bubble domain sensors without the usual loss in data rate. Thus, the use of two sensor-dummy sensor pairs enables the thick sensor to be advantageously used without operating the entire bubble memory at half the usual data rate.

FIG. 3

FIG. 3 shows a major/minor loop memory organization, the output of which provides the data streams to a bridge circuit sensor of the type shown in FIG. 1. In this arrangement, the sensor is a unique part of the memory organization and enables several advantages to occur. In more detail, the major loops 60 are used as I/O loops to supply data from generators G to the minor loops 62A, 62B, 62C, 62D and to the minor loops 64A, 64B, 64C, 64D, in a well known manner (U.S. Pat. No. 3,618,054). Minor loops 64A–64D are spatially displaced from minor loops 62A–62D one bit position measured along major loop 60. Propagation path 66 connects the data from loops 62A–62D to channel 1 leading to sensor S, while propagation path 68 connects data from loops 64A–64D to channel 2 leading to sensor S.

Since the minor loops are two bit positions apart in a conventional major/minor loop memory, the bits in each data stream going to bridge circuit sensor S will be in alternate bit positions, in the manner more fully described with respect to FIG. 1. Also, since minor loops 64A–64D are staggered by one bit position with respect to minor loops 62A–62D, the data stream along channel 2 will be one bit position out of phase with respect to the data stream along channel 1. Thus the unique combination of a major/minor loop memory organization and the bridge sensor S provides the proper data streams to obtain full data rate sensing and soft error detection.

As an alternative, the minor loops on each side of the major loop can be aligned with one another, but with different sets of transfer conductors used to transfer information between the major loop and each set of minor loops. Thus, information can be sent from minor loops 62A–62D to the major loop at a time which is one drive cycle different than the time during which information is sent from minor loops 64A–64D to the major loop. This will provide data streams along channels 1 and 2 which are staggered in time with respect to one another.

FIG. 4

Figure 4:
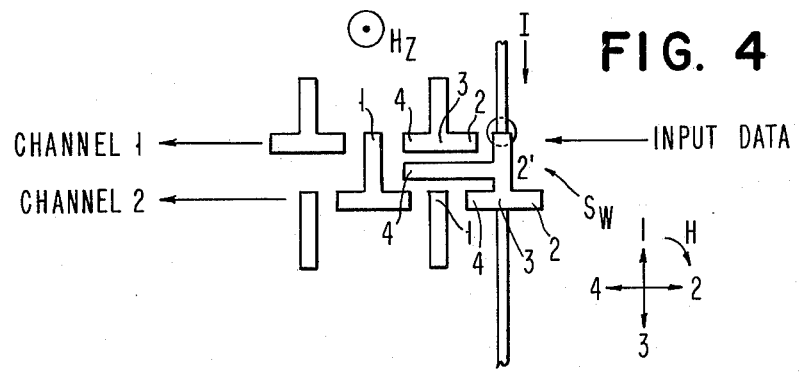
FIG. 4 shows a device for sending alternate data bits along two different propagation paths.

FIG. 4 shows a circuit for sending alternate bits of a single data stream to two different propagation channels. This type of circuit can be used to provide data bits in alternate bit positions in propagation channels 1 and 2 of FIG. 1. In more detail, bubble domains in the input data stream enter the switch SW in the direction of arrow 70 and exit along either propagation channel 1 or propagation channel 2, depending upon the presence or absence of a current I in conductor 72. A bubble domain B at pole position 1 of magnetic switch element 74 would normally go to pole position 2' of this element as the field H moved to direction 2. However, a current I in conductor 72 during phase 1 of drive field H will cause magnetic pole 2 on T-bar 76 to be more attractive than pole 2' on element 74. Therefore, the bubble domain B at pole position 1 of element 74 will propagate to pole position 2 on T-bar 76 as field H rotates to direction 2. The domain will then continue to move to the left along channel 1.

If there were no current I present in conductor 72 during field phase 1, the domain B would have gone to pole 2' on element 74 as filed H moved to direction 2. After this, the domain would have gone to pole positions 3 and 4 on this element as field H continued to reorient. Consequently, the domain would move along the direction of propagation channel 2 in the absence of current I in conductor 72.

Therefore, a switch SW can be used to steer input data along either of two directions depending upon the presence or absence of the current I. This switch can be used to send alternate data bits along channels 1 and 2 of the structure shown in FIG. 1. Consequently, since the output bridge sensor S provides a signal during each cycle of the drive field, each sensor-dummy sensor pair will sense alternate bits of the original data stream and thereby the sensor S will provide an output during each cycle of the drive field. Consequently, full data rate sensing will be achieved while at the same time soft errors will be detected.

EXAMPLE

Sensors similar to those shown in FIGS. 1 and 2 were constructed using permalloy chevron elements. Each sensor S1, S2 and each dummy sensor D1, D2 was comprised of 215 individual chevron elements which were connected in series as shown in FIG. 1. The propagation chevron elements and the sensing chevron elements were approximately 2500 Angstroms in thickness. For 2 micron diameter bubble domains in amorphous Gd-Co-Mo magnetic material, 3 $mV$ output signals were achieved during quasistatic operation with a rotating drive field H of approximately 40 O.

ALTERNATIVES

Although chevron-type propagation and sensing elements have been shown, it should be understood that other geometries can be used. Additionally, the Hall effect can be used to sense bubble domains rather than the magnetoresistive effect as was illustrated. However, the magnetoresistive effect is more sensitive and requires only two terminals per sensor thereby minimizing the number of conductor interconnections.

In a desired embodiment, both the sensing elements and the conductors used to provide the bridge circuit can be provided from the same magnetic material (permalloy). However, when this is done it is preferable to have all balancing elements in the bridge sensor have the same length so that all legs of the sensor and all interconnections exhibit the same resistance. These factors are well known to those familiar with circuit design and will be fully apparent to them.

While the specific bridge circuit and the particular coding shown provides ease of output detection, it will be recognized by those of skill in the art that the sensor and dummy sensors can be interchanged in the bridge circuit to obtain alternate coding schemes having different output levels. All possible interchanges of the sensors and dummy sensors lead to coding schemes which can be used to reconstruct the original data streams and furthermore to detect soft errors as they occur. Thus, for example, multiple dummy sensors can be used in each propagation channel or the positions of the dummy sensors with respect to their associated sensors can be changed. Still further, the sensors and dummy sensors can be electrically interconnected to provide other bridge circuit arrangements which will be fully understood and appreciated by those having skill in the art.

What has been shown is an improved sensor for detection of magnetic bubble domains which overcomes the usual speed deficiency of thick film sensors and which provides soft error detection. The proposed sensor arrangement uses thick magnetic elements, where "thick" is defined as a magnetic element having approximately the same thickness as the thickness of the bubble domain propagation elements (generally, they are deposited at the same time and have identical thickness), which is commonly greater than 200–400 Angstroms. This sensor arrangement enables one to use thick sensing elements while at the same time being able to sense bubble domains at the full data rate used to move the domains in the propagation circuitry. Additionally, and just as importantly, this arrangement allows detection of soft errors in the detector circuitry. Thus, although bridge-type circuits are widely known for detection of magnetic domains, a bridge circuit in which the dummy sensors additionally sense bubble domains is provided, thereby achieving a configuration which can be operated at full data rate with soft error detection.

What is claimed is:

1. An apparatus for detection of magnetic bubble domains in a magnetic medium, comprising:
    a first thick sensor element comprised of a magnetic material disposed in flux coupling proximity to a first bubble domain data pattern following a path in said magnetic medium in response to the application of cycles of a drive field and a first associated thick dummy sensor element comprised of a magnetic material also disposed in flux coupling proximity to said first bubble domain data pattern as it continues along said path,
    a second thick sensor element comprised of a magnetic material disposed in flux coupling proximity to a second bubble domain data pattern following a second path in said magnetic medium in response to the application of said cycles of drive field and a second associated thick dummy sensor element comprised of a magnetic material also disposed in flux coupling proximity of said second bubble domain data pattern as it continues along said path in said magnetic medium,
    said first and second sensor elements and said first and second dummy sensor elements being arranged in an electrical bridge circuit, said apparatus detecting said data bubble domains during each cycle of said drive field.

2. The apparatus of claim 1, where said first and second sensor elements and said first and second dummy sensor elements are comprised of NiFe.

3. The apparatus of claim 1, where said first and second sensor elements are located on opposite sides of said bridge circuit, while said first and second dummy sensor elements are located on opposite sides of said bridge circuit.

4. The apparatus of claim 3, including means for applying electrical current through said sensor elements and said dummy sensor elements during each cycle of drive field.

5. The apparatus of claim 1, where the spacing between said first sensor element and said first dummy sensor element is the same as that between said second sensor element and said associated second dummy sensor element.

6. The apparatus of claim 1, where said first and second bubble domain data patterns have data bits in alternate bit positions, said first and second bubble domain data patterns being displaced from one another by one cycle of drive fields.

7. The apparatus of claim 6, further including a major/minor loop bubble domain memory and propagation paths for connecting said memory to said detection apparatus, where said first and second data patterns are comprised of data which propagates from said major/minor loop memory to said detection apparatus.

8. An apparatus for sensing magnetic bubble domains moving in a magnetic medium in response to cycles of drive fields, comprising:
    at least two bubble domain sensor - dummy bubble domain sensor pairs, connected in a bridge circuit, each sensor and each dummy bubble sensor being arranged to be in flux coupling proximity to said magnetic bubble domains during different cycles of said drive fields.

9. The apparatus of claim 8, where the sensor and dummy sensor in each pair is responsive to the same bubble domain pattern, said dummy sensor detecting said bubble domain pattern in a different cycle than said sensor.

10. The apparatus of claim 9, where each said bubble domain sensor-dummy pair detects a different bubble domain pattern, each said pattern having data bits in alternate bit positions and being displaced from one another by one cycle.

11. The apparatus of claim 8, where said sensors and dummy sensors are comprised of magnetoresistive sensing elements.

12. An apparatus for sensing magnetic bubble domains in a magnetic medium, comprising:

at least four sense elements arranged in a bridge circuit, and means for passing current through said elements, wherein a first two of said sense elements are physically located so that each of said first two elements is responsive to a first bubble domain data pattern at different times and the other two sense elements are physically located so that each of said other two sense elements is responsive to a second bubble domain data pattern at different times.

13. The apparatus of claim 12, further including a major/minor loop bubble domain memory for providing said first and second bubble domain patterns to said sense elements.

* * * * *